United States Patent
Kanoh et al.

(10) Patent No.: US 7,787,079 B2
(45) Date of Patent: Aug. 31, 2010

(54) GENERATION OF PATTERN DATA WITH NO OVERLAPPING OR EXCESSIVE DISTANCE BETWEEN ADJACENT DOT PATTERNS

(75) Inventors: Hiroshi Kanoh, Tokyo (JP); Teruaki Suzuki, Tokyo (JP)

(73) Assignees: NEC Corporation, Tokyo (JP); NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 12/462,710

(22) Filed: Aug. 7, 2009

(65) Prior Publication Data

US 2009/0322757 A1 Dec. 31, 2009

Related U.S. Application Data

(62) Division of application No. 10/487,496, filed as application No. PCT/JP02/09012 on Sep. 5, 2002, now Pat. No. 7,612,847.

(30) Foreign Application Priority Data

Sep. 7, 2001 (JP) ............................. 2001-272165

(51) Int. Cl.
G02F 1/1335 (2006.01)

(52) U.S. Cl. ........................................ 349/113; 345/30

(58) Field of Classification Search .................. 349/113
See application file for complete search history.

(56) References Cited

U.S. PATENT DOCUMENTS

| | | | | |
|---|---|---|---|---|
| 4,061,820 A | * | 12/1977 | Magid et al. | 428/317.3 |
| 4,574,311 A | * | 3/1986 | Resnikoff et al. | 348/315 |
| D331,665 S | * | 12/1992 | Underhill | D5/53 |
| 6,219,113 B1 | * | 4/2001 | Takahara | 349/42 |
| 6,254,965 B1 | * | 7/2001 | McGuire et al. | 428/141 |
| 6,421,052 B1 | * | 7/2002 | McGuire | 345/441 |
| 6,522,375 B1 | * | 2/2003 | Jang et al. | 349/113 |
| 6,665,030 B2 | * | 12/2003 | Hanazawa et al. | 349/113 |
| 7,173,659 B2 | * | 2/2007 | Berstis | 348/294 |
| 7,277,143 B2 | * | 10/2007 | Funahata et al. | 349/114 |
| 7,612,847 B2 | * | 11/2009 | Kanoh et al. | 349/113 |
| 2003/0011618 A1 | * | 1/2003 | Deering | 345/613 |
| 2004/0239844 A1 | * | 12/2004 | Kanoh et al. | 349/113 |
| 2005/0030452 A1 | * | 2/2005 | Jang | 349/113 |
| 2005/0083454 A1 | * | 4/2005 | Sumi | 349/113 |
| 2005/0248702 A1 | * | 11/2005 | Hoshino | 349/113 |
| 2005/0264728 A1 | * | 12/2005 | Funahata et al. | 349/114 |
| 2007/0091247 A1 | * | 4/2007 | Onda | 349/153 |
| 2007/0146577 A1 | * | 6/2007 | Sumi | 349/96 |
| 2009/0228539 A1 | * | 9/2009 | Kanoh et al. | 708/250 |
| 2009/0322757 A1 | * | 12/2009 | Kanoh et al. | 345/440 |
| 2010/0079978 A1 | * | 4/2010 | Nakamura | 362/97.1 |

* cited by examiner

*Primary Examiner*—Sath V. Perungavoor
(74) *Attorney, Agent, or Firm*—Muirhead and Saturnelli, LLC

(57) ABSTRACT

A device is disclosed for generating pattern data for unevenness that is randomly arranged on the surface of the reflective substrate of a reflective liquid crystal display device. The number of coordinates, a basic pitch, a movable range, and a dot diameter are entered from a data entry unit. An array generation unit regularly arranges base coordinates in two dimensions in accordance with the basic pitch. Coordinate displacement unit randomly displaces within the movable range at a portion of the basic coordinates to generate a multiplicity of displaced coordinates. Pattern generation unit arranges dot patterns with the dot diameter entered at each of the displaced coordinates generated to generate pattern data.

5 Claims, 9 Drawing Sheets displacement

Fig. 4B
line width: W
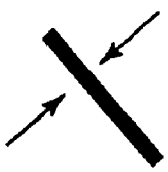
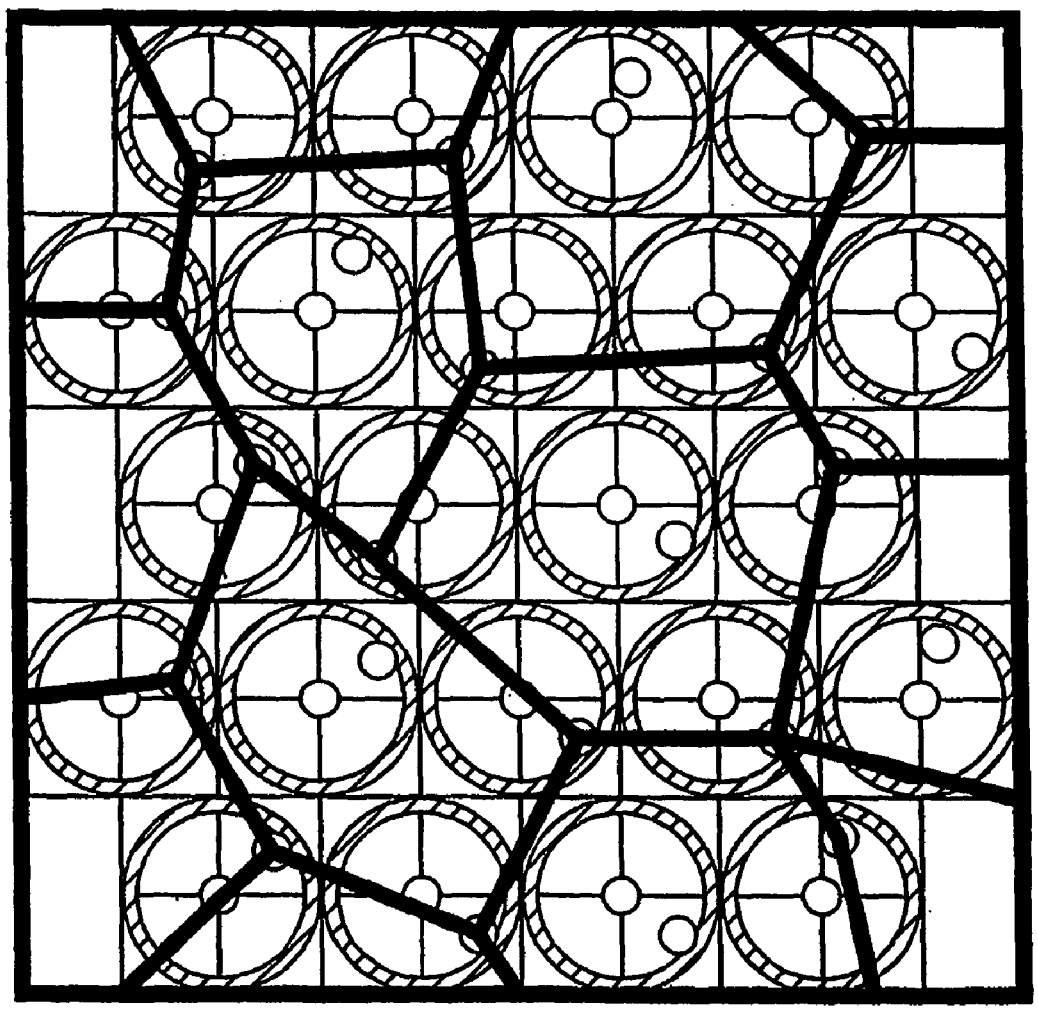

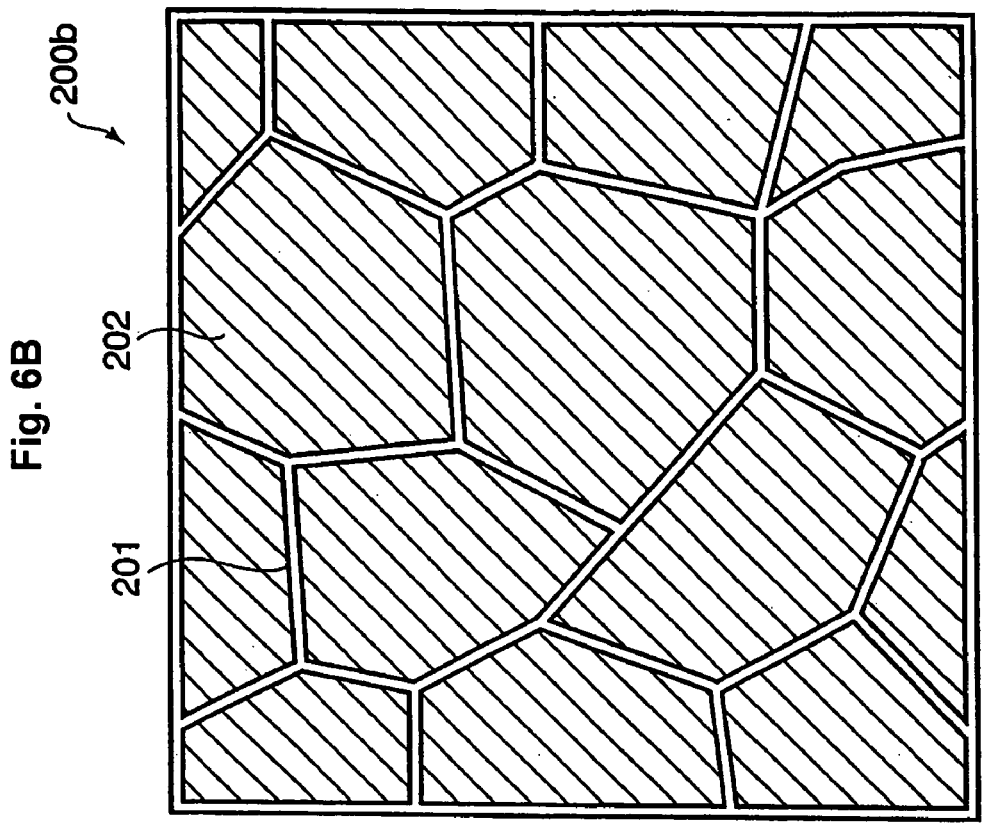
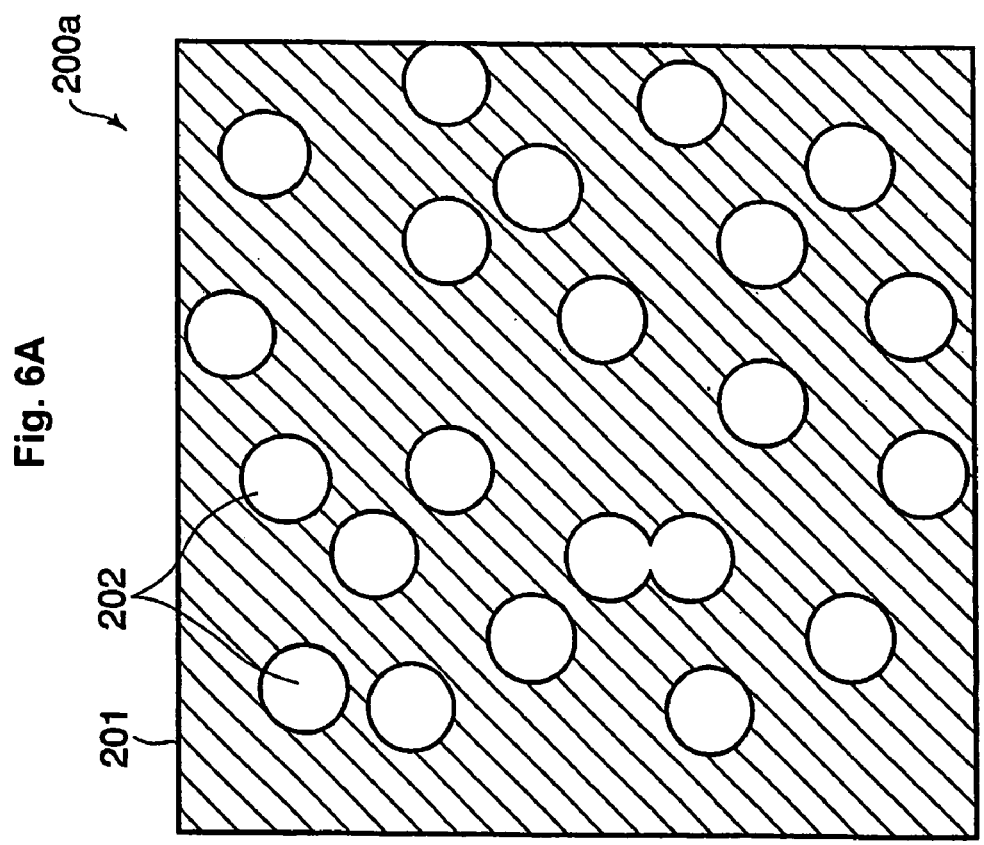

GENERATION OF PATTERN DATA WITH NO OVERLAPPING OR EXCESSIVE DISTANCE BETWEEN ADJACENT DOT PATTERNS

CROSS-REFERENCE TO RELATED APPLICATIONS

This application is a divisional of U.S. application Ser. No. 10/487,496, filed Feb. 23, 2004, now U.S. Pat. No. 7,612,847 which is the National Stage of International Application No. PCT/JP02/09012, filed Sep. 5, 2002, which are both hereby incorporated by reference.

TECHNICAL FIELD

The present invention relates to a pattern generator for generating pattern data that can be used for producing unevenness of the reflecting surface of a reflector.

BACKGROUND OF THE ART

Power saving, compact, and lightweight liquid crystal displays are now widely used in portable terminal devices such as mobile telephones and PDAs (Personal Digital Assistants). These liquid crystal displays include transmissive and reflective types. From the standpoint of viewability, a transmissive type display in which a backlight is incorporated is now typically employed.

The use of a backlight, however, not only increases power consumption, but also stands in the way of smaller size and lighter weight. Therefore, there exists a need for a reflective liquid crystal display that has good viewability, particularly for portable terminal devices in which small size and light weight are critical and that use a battery as a power source. A known technique for improving the viewability of such a reflective liquid crystal display involves forming unevenness on the reflecting surface of the reflective substrate to improve the reflection characteristics of the reflective substrate. This technique is disclosed in, for example, Japanese Patent Publication No. 2,912,176.

In order to form random unevenness on the reflecting surface of a reflective substrate in this way, pattern data must be generated in which dot patterns, which are to form depressions or protrusions, are randomly distributed. As one example of a method of generating such pattern data, a multiplicity of base coordinates that are regularly distributed horizontally and vertically at a predetermined pitch may be randomly displaced and dot patterns then arranged at each of these randomly displaced coordinates.

However, this simple and random displacement of the base coordinates at which dot patterns are arranged may result in problems such as overlapping of neighboring dot patterns or excessive distance between neighboring dot patterns. Excessive distance between neighboring dot patterns in particular results in a reflecting surface that reflects all incident light, which seriously degrades the reflection characteristics of the reflective substrate.

SUMMARY OF THE INVENTION

It is an object of the present invention to provide a pattern generator that can generate pattern data in which overlap or excessive distance between randomly displaced dot patterns can be prevented.

It is another object of the present invention to provide a photomask using pattern data that have been generated by the above-described pattern generator and a device for fabricating the same.

It is yet another object of the present invention to provide a ray-reflecting member having excellent reflection characteristics and a device for fabricating the same.

It is yet another object of the present invention to provide a liquid crystal display having excellent viewability and a device for fabricating the same.

It is still another object of the present invention to provide a portable terminal device that is small and lightweight and that allows a reduction of power consumption.

A first pattern generator according to the present invention generates pattern data in which a multiplicity of displaced coordinates are generated that are randomly arranged in two dimensions with a limitation on the arrangement of patterns to prevent overlap or excessive distance between patterns; and in which a predetermined pattern to form unevenness is arranged at least a portion of or all of the generated displaced coordinates. Overlapping or excessive distance between the predetermined pattern for unevenness can thus be prevented by means of the movable range.

The second pattern generator according to the present invention generates pattern data in which a multiplicity of displaced coordinates are generated that are randomly arranged in two dimensions with a limitation on the arrangement of patterns to prevent overlap or excessive distance between patterns; and in which a predetermined dot pattern to form unevenness are arranged at least a portion of or all of the generated displaced coordinates. Overlapping or excessive distance between the predetermined dot patterns for unevenness can thus be prevented by means of the movable range.

The third pattern generator according to the present invention generates pattern data in which a multiplicity of displaced coordinates are generated that are randomly arranged in two dimensions with a limitation on the arrangement of patterns to prevent overlap or excessive distance between patterns; and in which a predetermined line pattern to form unevenness are arranged at least a portion of or all of the generated displaced coordinates. Overlapping or excessive distance between line patterns can thus be prevented by means of the movable range.

The fourth pattern generator according to the present invention arranges regularly a multiplicity of base coordinates in two dimensions according to a basic pitch entered and randomly displaces at least a portion of the multiplicity of base coordinates that has been arranged within a movable range to generate as data a multiplicity of displaced coordinates, and arranges dot patterns with a predetermined dot diameter at each of the multiplicity of displaced coordinates to generate pattern data. Overlapping or excessive distance between dot patterns can thus be prevented by means of the movable range.

The fifth pattern generator according to the present invention regularly arranges a multiplicity of base coordinates in two dimensions according to a basic pitch and randomly displaces at least a portion of the multiplicity of base coordinates that has been generated within a movable range to generate as data a multiplicity of displaced coordinates, and arranges a line pattern with a predetermined line width at each side of a plurality of predetermined polygons that take at least a portion of the multiplicity of displaced coordinates that has been generated as vertices to generate pattern data. Overlapping or excessive distance between line patterns can thus be predetermined by means of the movable range.

According to an embodiment of the present invention, a line pattern with a line width is arranged at each side of, as the polygons that take at least a portion of the multiplicity of displaced coordinates as vertices, hexagons; and line patterns are randomly displaced from the basic positions of each side of the hexagons to generate pattern data. Excellent reflection characteristics can thus be achieved when the pattern data that have been thus generated are applied to the formation of unevenness on the reflecting surface of the reflective substrate of a reflective liquid crystal display.

Pattern data in which neighboring dot patterns do not overlap each other can be generated by confirming that the basic pitch P, the movable range R, and the dot diameter D that are entered satisfy the relationship:

$$P \geq 2R + D.$$

Pattern data in which neighboring line patterns do not overlap each other can thus be generated by confirming that the basic pitch P, the movable range R, and the line width W that are entered satisfy the relationship:

$$P \geq 2R + W.$$

In addition, by arranging base coordinates at positions such that even-numbered rows of the base coordinate are displaced by one-half the basic pitch in the column direction relative to odd-numbered rows of the base coordinates, the base coordinates can be simply arranged at the positions of the vertices of pseudo equilateral triangles.

Alternatively, the base coordinates can be randomly displaced by simple data processing by displacing the base coordinates within a movable range in accordance with random numbers that are generated by a random number generation means.

Further, when applying generated pattern data to the formation of unevenness on the reflecting surface of the reflective substrate of a reflective liquid crystal display, excellent reflection characteristics can be achieved by displacing the base coordinates such that the half-width of the distribution graph of the displacements of the displaced coordinates satisfies:

$$0.3P \leq H \leq 0.9P$$

In a photomask fabrication device according to the present invention, either light-transmitting portions or light-blocking portions are formed on a mask material using pattern data that have been generated by the above-described pattern generator to form the light-transmitting portions or light-blocking portions of the photomask with dot patterns or line patterns that are randomly displaced within a movable range from the regular base coordinates. A photomask can thus be fabricated that can be used in forming unevenness having excellent reflection characteristics on the reflecting surface of a reflective substrate of a reflective liquid crystal display.

The photomask of the present invention is fabricated by the above-described photomask fabrication device.

In the first photomask of the present invention, either a light-transmitting portion or a light-blocking portion is formed with a dot pattern with a predetermined dot diameter at each of a multiplicity of displaced coordinates in which at least a portion of a multiplicity of base coordinates that have been regularly arranged according to a basic pitch have been randomly displaced within a movable range. Since dot patterns that have been randomly displaced within a movable range from the regular base coordinates are exposed by rays that have transmitted through the light-transmitting portions, unevenness having excellent reflection characteristics can be formed on the reflecting surface of the reflective substrate of a reflective liquid crystal display.

In the second photomask of the present invention, either a light-transmitting portion or a light-blocking portion is formed with a line pattern with a line width on each side of a plurality of polygons that take as vertices at least a portion of a multiplicity of displaced coordinates in which at least a portion of the multiplicity of base coordinates that have been regularly arranged in accordance with a basic pitch are randomly displaced within a movable range. Since line patterns that have been randomly displaced within a movable range from regular basic positions are exposed by rays that have been transmitted by the light-transmitting portions, unevenness having excellent reflection characteristics can be formed on the reflecting surface of a reflective substrate of a reflective liquid crystal display.

In the third photomask of the present invention, either a light-transmitting portion or a light-blocking portion is formed with a line pattern with a predetermined line width at each side of a multiplicity of hexagons that have been regularly arranged. Since line patterns are exposed at the positions of each side of the hexagons by light rays that have transmitted through the light-transmitting portions, unevenness having excellent reflection characteristics can be formed on the reflecting surface of the reflective substrate of a reflective liquid crystal display.

The first reflector fabrication device according to the present invention forms unevenness on the reflecting surface of a reflector by photoetching that employs the above-described photomask. Because unevenness of the reflecting surface of the reflector is formed with a dot pattern or a line pattern that has been randomly displaced from regular basic positions within a movable range, a reflective substrate of a reflective liquid crystal display having an excellent reflection characteristic can be fabricated.

Specifically, at least a portion of the surface of a base member is subjected to photoetching by a photomask to form unevenness, and a metal thin-film is formed on the surface of the base member in which this unevenness has been formed. Since the same unevenness as the surface of the base member can be produced on the surface of the metal thin-film, a reflective substrate of a reflective liquid crystal display having superior reflection characteristics can be easily fabricated through photoetching that employs a photomask.

The second reflector fabrication device according to the present invention receives pattern data that have been generated by the above-described pattern generator and forms either depressions or protrusions on the surface of a reflector with this pattern data. Since unevenness can be formed on the reflecting surface of a reflector with dot patterns or line patterns that have been randomly displaced within a movable range from regular basic positions, unevenness having excellent reflection characteristics can be formed on the reflecting surface of the reflective substrate of a reflective liquid crystal display.

Specifically, either depressions or protrusions are formed with pattern data on the surface of a metal thin-film of the surface of a base member having a metal thin-film formed on at least a portion of its surface. Since unevenness is formed on the surface of the metal thin-film, the reflective substrate of a reflective liquid crystal display having excellent reflection characteristics can be easily fabricated through photoetching that does not employ a photomask.

The reflector according to the present invention is fabricated by the above-described reflector fabrication device.

In the first reflector of the present invention, depressions or protrusions are formed on a reflecting surface with dot patterns that have been randomly displaced within a movable range from regular basic positions.

In the second reflector according to the present invention, depressions or protrusions are formed on a reflecting surface with line patterns that have been randomly displaced within a movable range from regular basic positions.

In the third reflector of the present invention, either depressions or protrusions are formed with a line pattern with a predetermined line width on each side of a multiplicity of hexagons that are regularly arranged. Accordingly, the third reflector can exhibit excellent reflection characteristics as the reflective substrate of a reflective liquid crystal display.

According to another aspect of the reflector of the present invention, unevenness is formed on the surface of a metal thin-film formed on the surface of a base member. Accordingly, by use of the metal thin-film as the picture element electrode of each liquid crystal picture element of a reflective liquid crystal display, a reflective substrate of superior structure can be achieved.

Further, excellent reflection characteristics can be achieved as the reflective substrate of a reflective liquid crystal display, if the average pitch Pa of depressions or protrusions satisfies the relationship: $1.0 \leq Pa \leq 80$ (μm), or, if the average pitch Pa and the half-width H of the pitch distribution graph of depressions or protrusions satisfy the relationship $0.3\ Pa \leq H \leq 0.9\ Pa$.

A liquid crystal fabrication device according to the present invention fabricates a reflective liquid crystal display in which a reflector fabricated by the above-described reflector fabrication device is used as the reflective substrate and a transparent substrate is arranged on the surface of the reflective substrate through a liquid crystal layer. As a result, a reflective liquid crystal display can be fabricated in which the reflective substrate has excellent reflection characteristics.

Due to the excellent reflection characteristics of the reflective substrate that can be achieved because the reflective substrate is constituted by the above-described reflector, the liquid crystal display of the present invention enables the display of an image with excellent viewability without the use of a backlight.

By using the liquid crystal display according to the present invention to display data, the portable terminal device according to the present invention can display an image with excellent viewability without the use of a backlight. Power consumption by a backlight is obviated, making the battery more compact and prolonging the time of use of the terminal.

BRIEF DESCRIPTION OF THE DRAWINGS

FIGS. 6A and 6B shows plan views of photomasks;

DETAILED DESCRIPTION OF THE PREFERRED EMBODIMENTS

Figure 1:
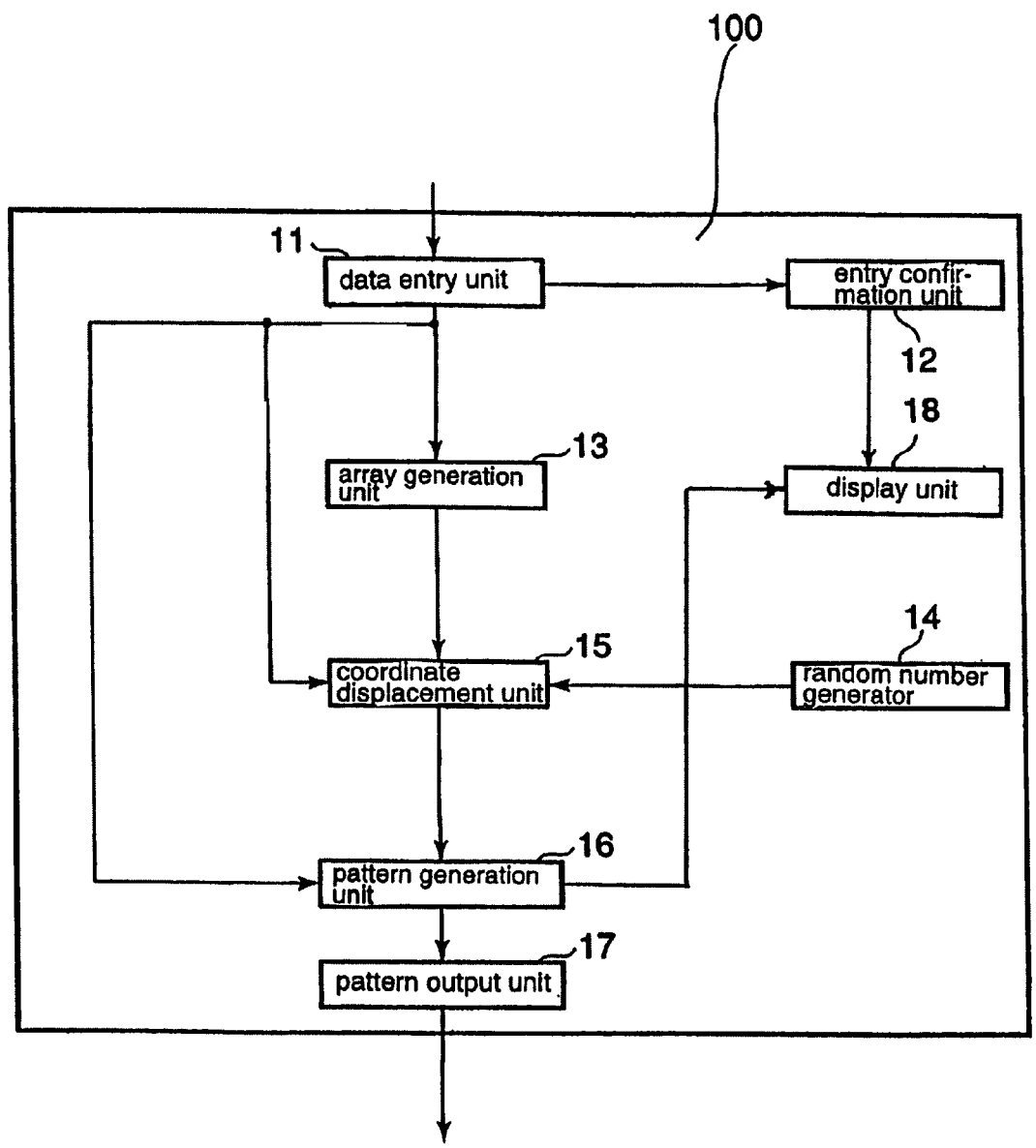
FIG. 1 is a block diagram showing a pattern generator according to an embodiment of the present invention.

Referring now to FIG. 1, pattern generator 100 according to an embodiment of the present invention comprises: data entry unit 11, entry confirmation unit 12, array generation unit 13, random number generator 14, coordinate displacement unit 15, pattern generation unit 16, pattern output unit 17, and display unit 18.

Data entry unit 11 receives various data as input, such as switch data, coordinate numbers, basic pitch P, movable range R, and dot diameter D.

Switch data are binary data for setting whether pattern data are to be generated as dot patterns or line patterns, as will be explained hereinbelow. These data are displayed on display unit 18. For example, an operator may apply input by means of, for example, keyboard operation in accordance with input guidance such as "Please designate the data format: (1) dot patterns, (2) line patterns."

The coordinate numbers are data of the number of base coordinates. Basic pitch P is data for arranging base coordinates at a regularly fixed spacing in the horizontal and vertical directions. Movable range R is a maximum of random displacement of the base coordinates. Dot diameter D is the diameter of a dot pattern.

For the sake of simplicity, an example will be described in which the pattern data are generated as dot patterns. However, as will be explained hereinbelow, pattern data may also be generated as line data, in which case line width W, which is the horizontal width of a line pattern, is entered instead of dot diameter D.

Entry confirmation unit 12 determines whether basic pitch P, movable range R, and dot diameter D (or line width W) that have been entered from data entry unit 11 satisfy the relationship:

$P \geq 2R + D$(or $W$).

If entry confirmation unit 12 determines that the above-described relationship is not satisfied, display unit 18 displays a guidance message such as "The relationship between basic pitch P, movable range R, and dot diameter D (or line width W) is improper. Should processing continue? Y/N."

Figure 2A:
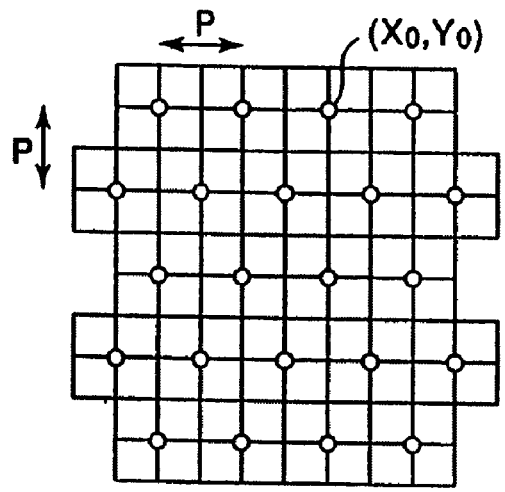
FIGS. 2A-2D is a schematic view of pattern generation process by the pattern generator of FIG. 1.

Array generation unit 13 regularly arranges a multiplicity of base coordinates in two dimensions according to basic pitch P that has been entered. However, in order to arrange the base coordinates at the positions of vertices of pseudo equilateral triangles in pattern generator 100 of this embodiment, the base coordinate are arranged such that the basic coordinates in even-numbered rows of the basic coordinates are displaced by half the basic pitch P in the column direction relative to odd-numbered rows of the basic coordinates, as shown in FIG. 2A.

Figure 2B:
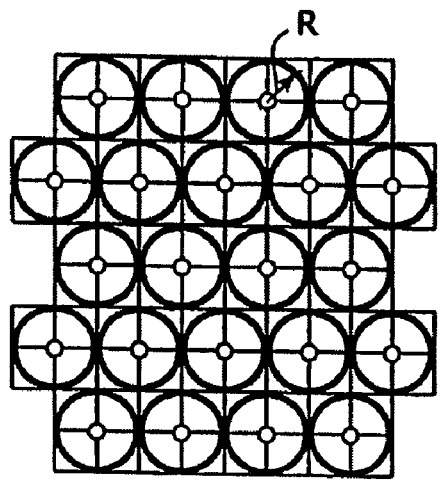
Figure 2C:
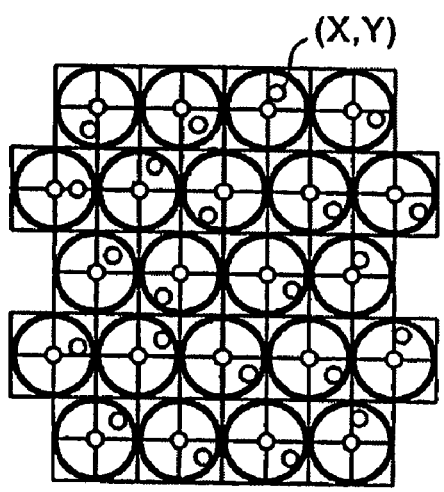

Random number generator 14 generates random numbers. Coordinate displacement unit 15 randomly displaces each of the multiplicity of base coordinates that have been regularly arranged by array generation unit 13 using random numbers that are generated by random number generator 14, thereby generating a multiplicity of displaced coordinates. In this case, the displacement is restricted within movable range R that has been entered from data entry unit 11, as shown in FIGS. 2B and 2C.

More specifically, the range of these random numbers is known beforehand because pseudo random numbers are generated that circulate as a sequential machine in pattern generator 100 of this embodiment. Two random numbers are generated for each of the multiplicity of base coordinates, the first random number being multiplied by a predetermined coefficient to produce a displacement angle of from 0° to 360°. A coefficient is then calculated such that the maximum value of the random number is the maximum value of movable range R, and the second random number is multiplied by this coefficient to produce a displacement distance. A position that is distant from a base coordinate by exactly the displacement distance is then rotated exactly the displacement angle from a reference direction, for example, in the row direction with the base coordinate as center to produce a randomly displaced coordinate.

Figure 3:
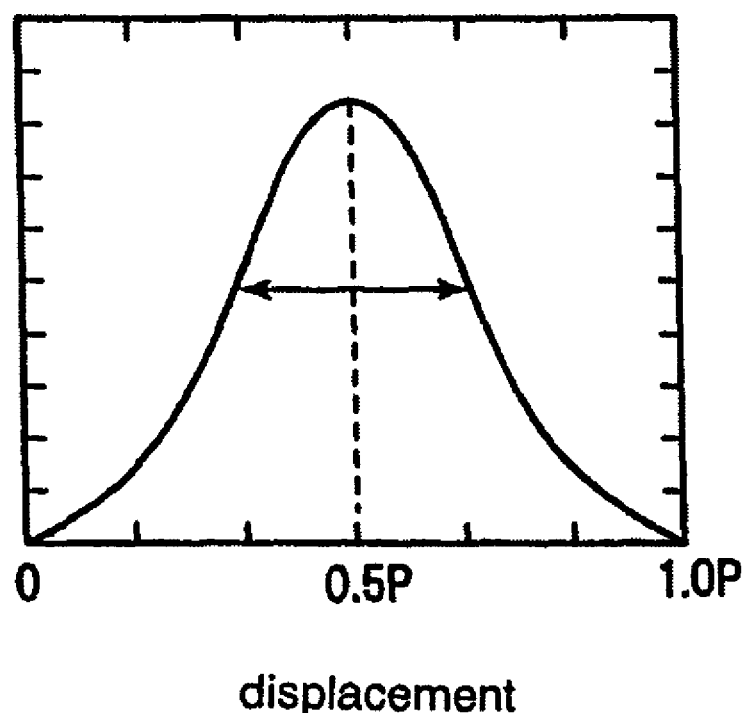
FIG. 3 is a distribution graph of the displacement pitch of displaced coordinates.

When generating displaced coordinates in a manner as described above, coordinate displacement unit 15 also generates a distribution graph of displacement of the displaced coordinates as shown in FIG. 3 and controls displacement of the base coordinates such that the half-width H and basic pitch P satisfy the relationship:

$$0.3P \leq H \leq 0.9P$$

Figure 2D:
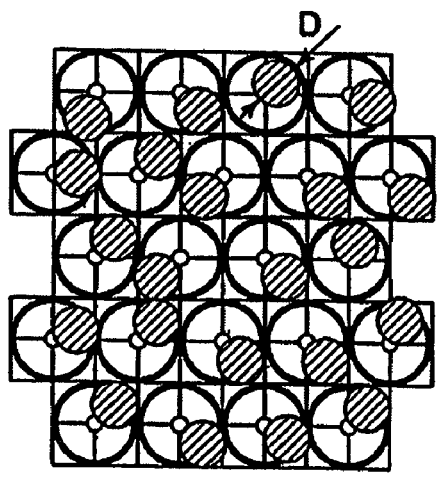

Pattern generation unit 16 generates pattern data in which a dot pattern with dot diameter D is arranged at each displaced coordinate that is generated by coordinate displacement unit 15 to generate pattern data, as shown in FIG. 2D. Pattern output unit 17 outputs the pattern data that have been generated by pattern generation unit 16. The data output of pattern output unit 17 is executed as, for example, data-writing to FD (Floppy Disk) by means of FDD (Floppy Disk Drive) or transmitting data online by means of an interface unit.

Dot patterns are not limited to circles as shown in FIG. 2D and may be of any separate, for example, ellipse or polygon such as triangle, quadrilateral, pentagon, and hexagon. Dot pattern data may be produced by arranging dot patterns at least a portion of the displaced coordinates produced by coordinate displacement unit 15.

Figure 4:
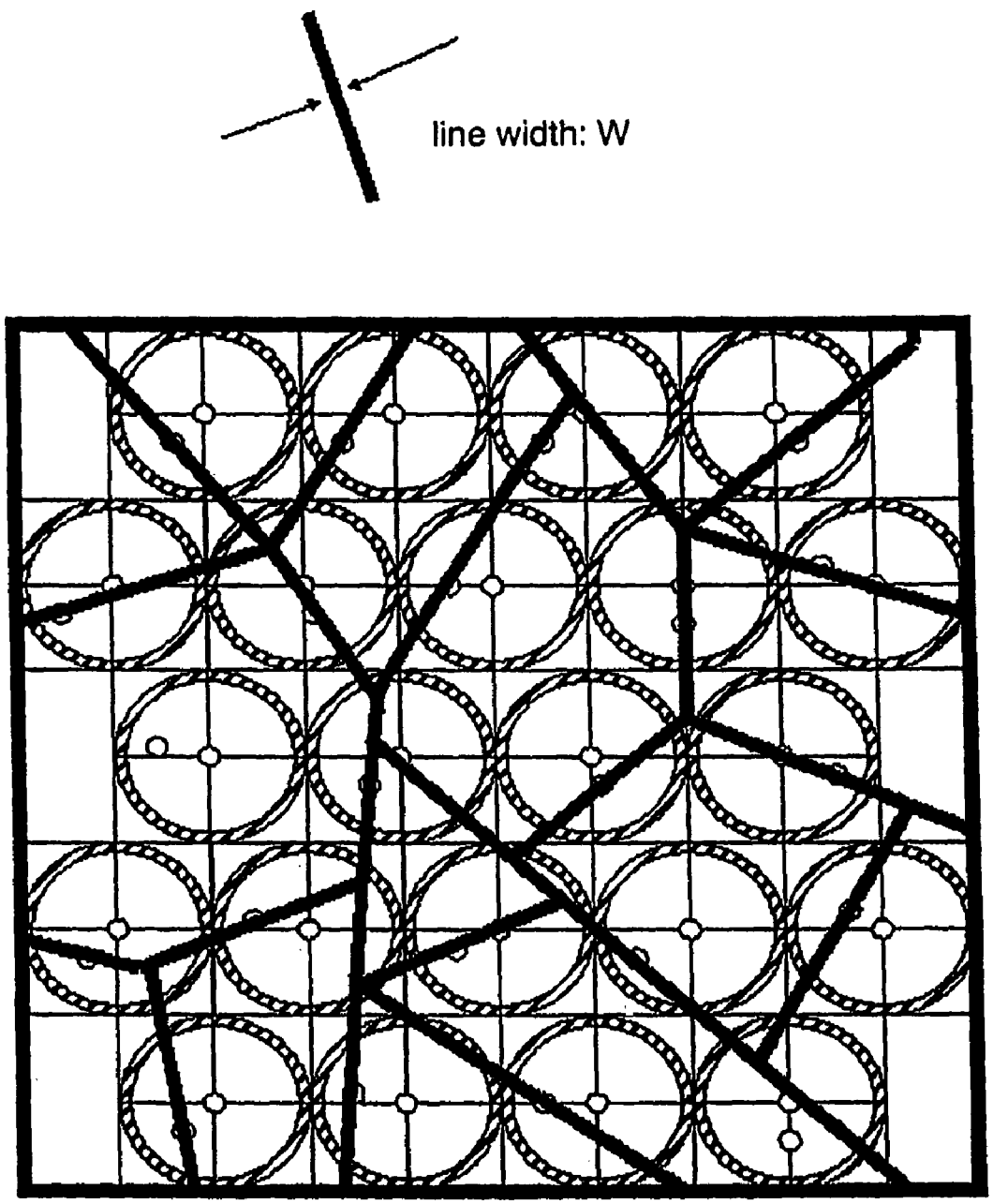
FIGS. 4A and 4B is a schematic view showing pattern data by line patterns.

When data generation based on line patterns is selected as described above, a predetermined line pattern with a line width W is arranged at each side of a hexagon that takes as vertices six displaced coordinates that are positioned in the vicinity of one displaced coordinate, as shown in FIG. 4. Alternatively, a predetermined line pattern with a line width W may be arranged at all of the displaced coordinates generated by coordinate displacement unit 15 to generate pattern data.

Furthermore, a line pattern with a line width W may be arranged at each side of a plurality of predetermined polygons that take at least a portion of the displaced coordinates generated by coordinate displacement unit 15 as vertices to generate pattern data. In particular, FIG. 4B shows a case in which a line pattern with a line width W is arranged at each side of hexagons that take six displaced coordinates around a single displaced coordinate as vertices.

Figure 5:
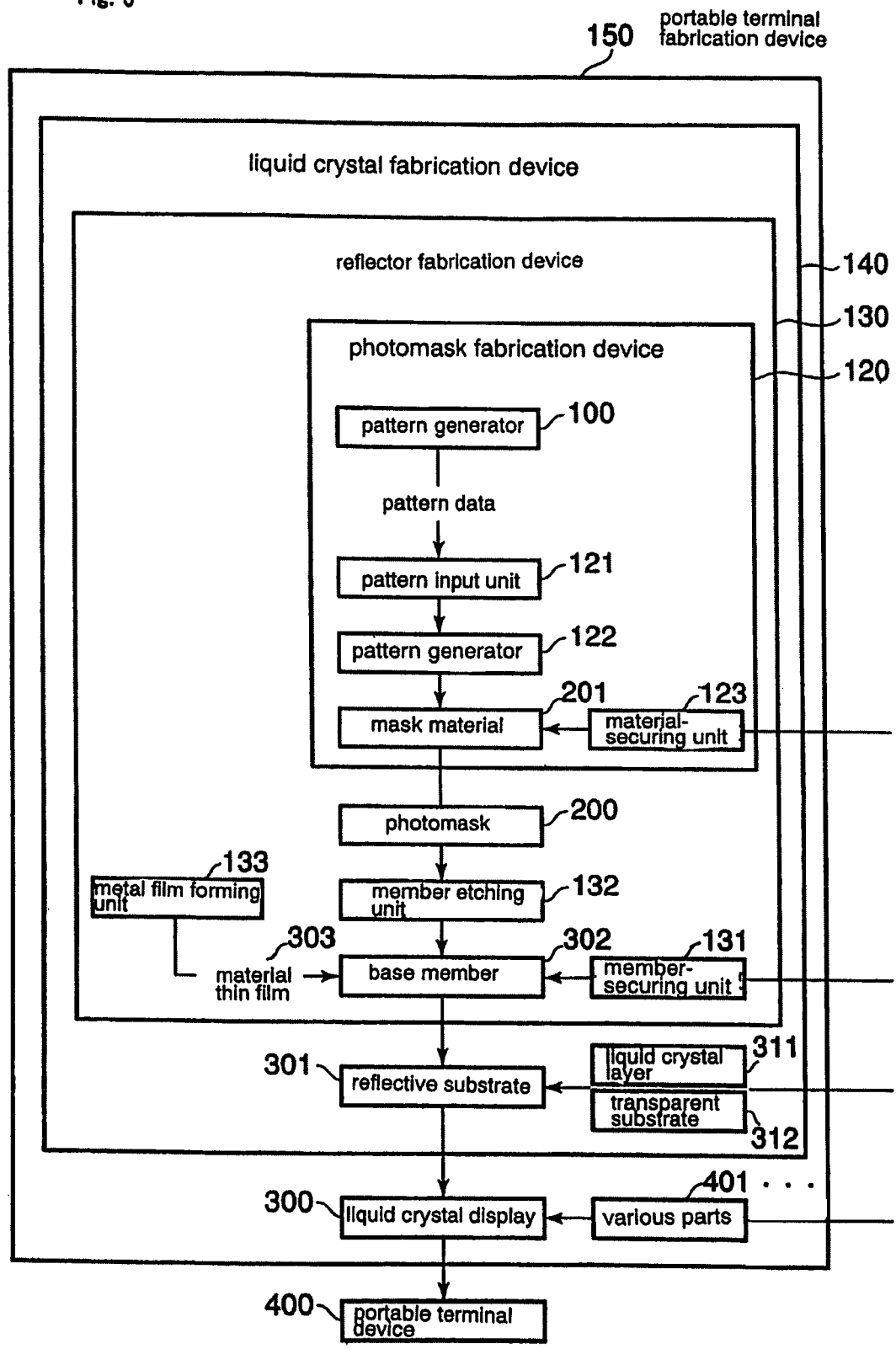
FIG. 5 is a block diagram of a portable terminal fabrication device.

FIG. 5 shows the constitution of photomask fabrication device 120 that employs pattern generator 100 of this embodiment, of reflector fabrication device 130 that employs photomask fabrication device 120, of liquid crystal fabrication device 140 that employs reflector fabrication device 130, and of portable terminal fabrication device 150 that employs liquid crystal fabrication device 140.

Photomask fabrication device 120 is a device for fabricating photomask 200 based on pattern data that are generated by pattern generator 100 and comprises pattern generator 100, pattern input unit 121, material-securing unit 122, and pattern-forming unit 123.

Pattern input unit 121 receives as input pattern data that have been generated by pattern generator 100. Material-securing unit 122 secures mask material 201 in position, and is, for example, a securing stage. Pattern-forming unit 123 forms light-transmitting portions 202 on mask material 201 that is secured by material securing unit 122 by photoetching using the pattern data and is, for example, an exposure device.

Photomask 200 is fabricated by photomask fabrication device 120 as described in the foregoing explanation. In this photomask 200, as shown in FIG. 6A, light-transmitting portions 202 are formed with a dot pattern with dot diameter D at a multiplicity of displaced coordinates that are derived by randomly displacing, within movable range R, a multiplicity of base coordinates that have been regularly arranged according to basic pitch P.

Reflector fabrication device 130 is a device that fabricates reflective substrate 301, which is a reflector of liquid crystal display 300, using photomask 200 that has been fabricated by photomask fabrication device 120. It comprises member-securing unit 131, member-etching unit 132, and metal-film forming unit 133.

Member-securing unit 131 secures base member 302 of reflective substrate 301 in a predetermined position and is constituted by, for example, a securing stage. Member-etching unit 132 uses photoetching that employs photomask 200 to form unevenness on the surface of base part 302 secured by member-securing unit 131 and is constituted by, for example, an exposure device. Metal-film forming unit 133 forms metal thin film 303 on the surface of base part 302 on which unevenness has been formed by member-etching unit 132 and is constituted by, for example, a film-forming device.

A method of forming unevenness by photoetching includes a series of photo lithography processes consisting of resist forming process, exposure process using photomask 200, and development process, for insulation film on the surface of member 302, and subsequent etching process of said insulation film using dryetching or wetetching and resist stripping process. Unevenness may be form by exposure and development processes by use of photomask 200, using a film having photosensitive capabilities as said insulation film. As said insulation film, use is made of inorganic insulation film such as silicone oxide film, silicone nitride film, or organic insulation film such as acrylic resin, polyimide resin. Film deposition system includes, for example, a sputter system, a chemical vapor deposition (CVD) system, and a spin coating system. An insulation film having photosensitive capabilities includes an organic film such as acrylic resin and polyimide resin. However, the insulation film is not limited to thrdr resin films, and may be one having photosensitive capabilities.

When fabricating reflective substrate 301 as described hereinabove, reflector fabrication device 130 sets the average pitch Pa of depressions or protrusions that occur on the surface of metal thin-film 303 to: $1.0 \, \mu m \leq Pa \leq 80 \, \mu m$.

Reflective substrate 301 is fabricated by reflector fabrication device 130 as described above. Unevenness is formed on a reflecting surface made up of the entire surface of metal thin-film 303 with dot patterns that are randomly displaced within movable range R from regular basic positions, as with photomask 200 shown in FIG. 6.

Liquid crystal fabrication device 140 is a device that fabricates reflective liquid crystal display 300 using reflective substrate 301 fabricated by reflector fabrication device 130. Portable terminal fabrication device 150 is a device that fabricates portable terminal device 400 using liquid crystal display 300 fabricated by liquid crystal fabrication device 140.

Figure 7:
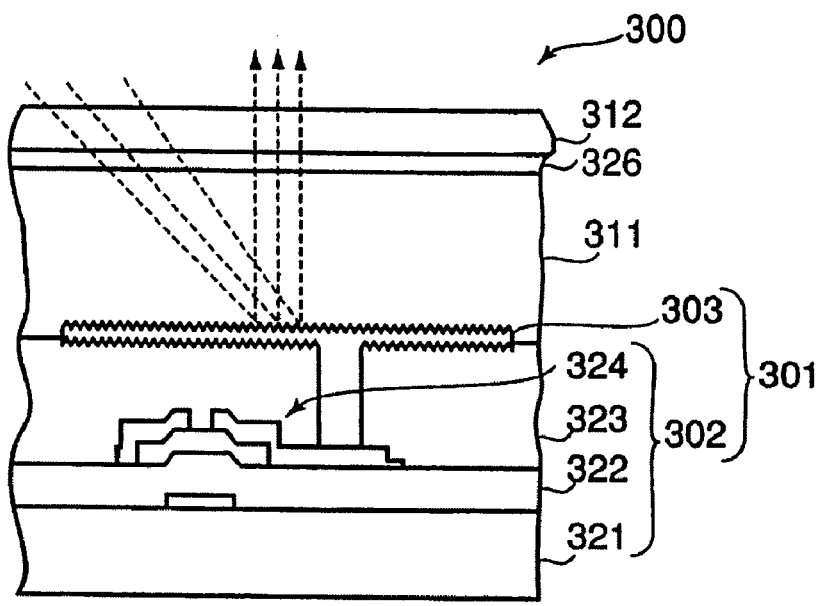
FIG. 7 is a vertical section of a frontal view showing the principle parts of a liquid crystal display.

As described hereinabove, liquid crystal display 300 is fabricated by liquid crystal fabrication device 140, and includes reflective substrate 301, liquid crystal layer 311, and transparent substrate 312. More specifically, base member 302 of reflective substrate 301 includes insulating substrate 321, on the surface of which first and second interlayer insulating films 322 and 323 are successively formed, as shown in FIG. 7.

Various thin films are formed on the surface of insulating substrate 321 and first interlayer insulating film 322, and driving circuits 324 such as TFTs (thin-film transistors) are formed by these thin-films, for each liquid crystal picture element 325. Metal thin-films 303 each connected to driving circuit 324 are formed on the surface of second interlayer insulating film 323 of base member 302 having such a construction for each liquid crystal picture element 325. As previously described, unevenness is formed on the surface of second interlayer insulating film 323 for each liquid crystal picture element 325, whereby unevenness is also produced on the entire surface of metal thin-film 303.

Second interlayer insulating film 323 is constituted by an insulation film having one or more layers, and use is made of inorganic insulation film such as silicone oxide film and silicone nitride film or organic insulation film such as acrylic resin and polyimide resin. Film deposition system includes, a sputter system, a chemical vapor deposition (CVD), and a spin coating system.

Transparent substrate 312 having transparent electrodes 326 formed on its entire back surface is integrally monolithically mounted on the surface of reflective substrate 301 having such construction through a frame spacer member (not shown). The space between transparent substrate 312 and reflective substrate 301 is then filled with liquid crystal layer 311.

Figure 8:
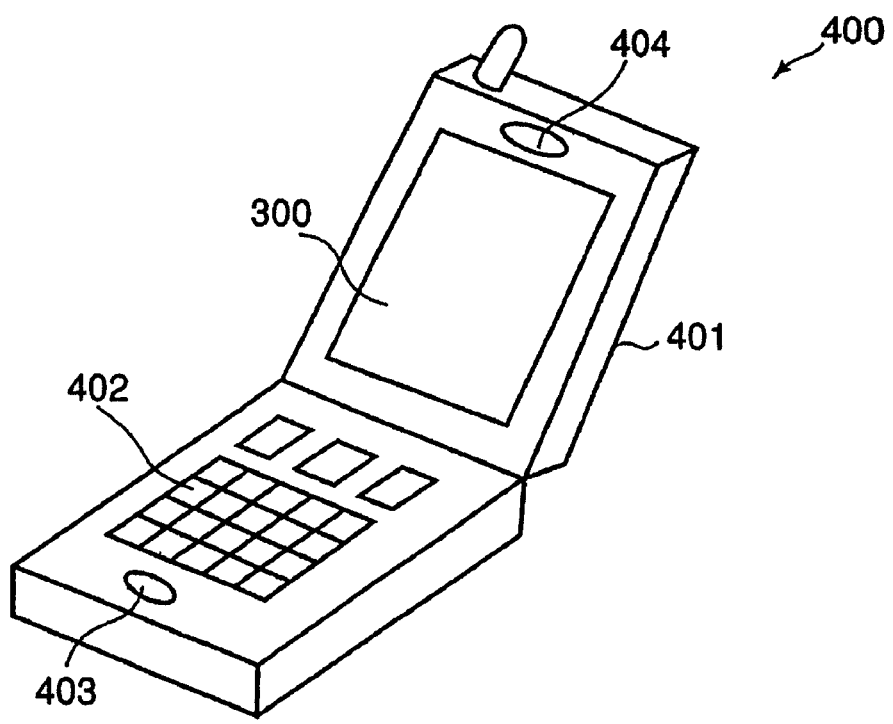
FIG. 8 is a perspective view of a portable terminal device.

As shown in FIG. 8, liquid crystal display 300 having this construction is mounted in an opening of main housing 401 of portable terminal device 400, which is a mobile telephone, and is exposed to the outside from the opening. Keyboard 402, microphone 403, and speaker 404 are also mounted in this main housing 401 so as to be exposed to the outside. A wireless communication unit, battery, and so on are accommodated inside main housing 401 (not shown).

The operations of pattern generator 100, photomask fabrication device 120, photomask 200, photo member fabrication device 130, reflective substrate 301, liquid crystal fabrication device 140, liquid crystal display 300, portable terminal fabrication device 150, and portable terminal device 400 having the above-described constructions will be described hereinbelow in order.

Figure 9:
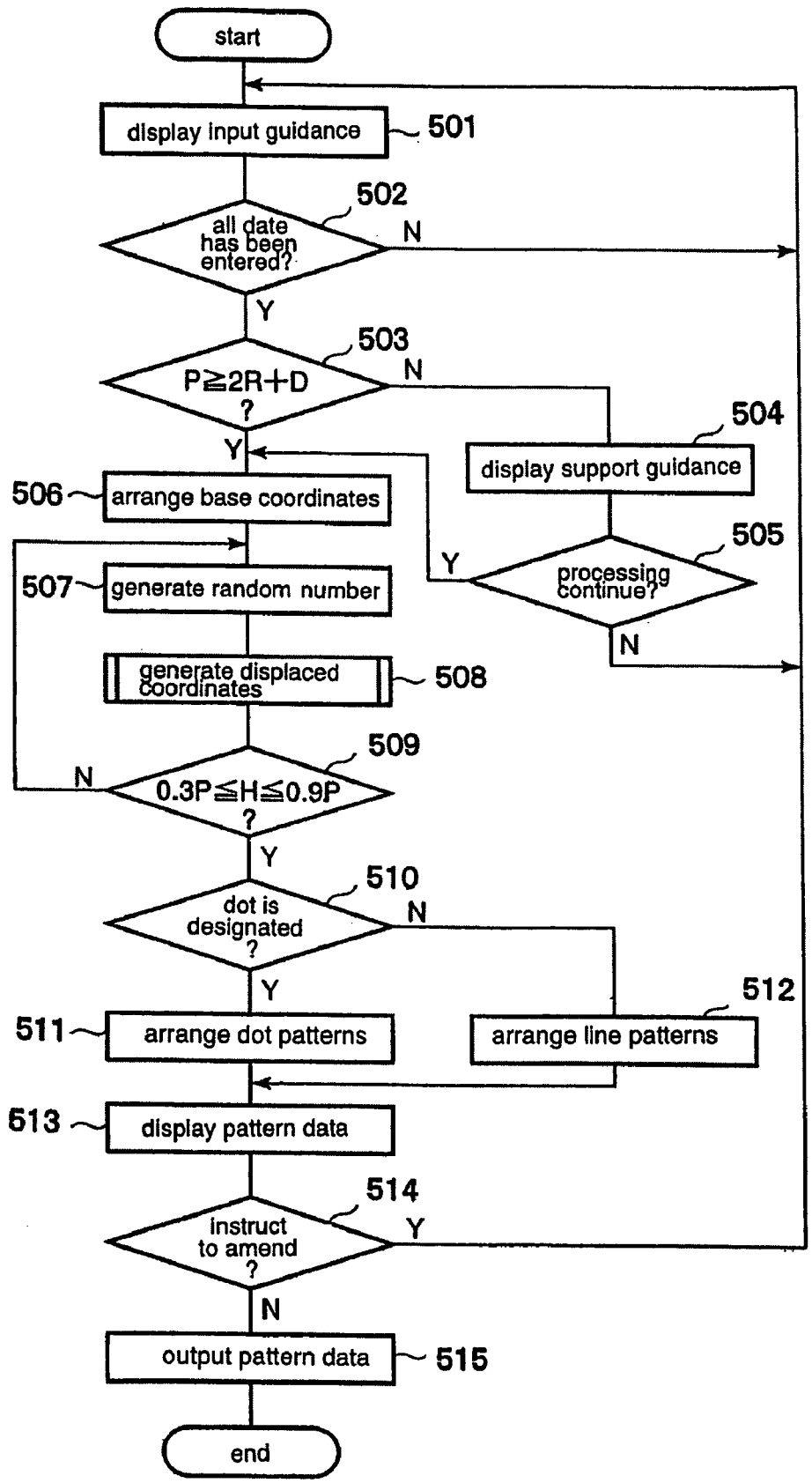
FIG. 9 is a flow chart illustrating pattern generation process by means of a pattern generator.

As shown in FIG. 9, when pattern data is generated by pattern generator 100, input guidance for switching data, the number of coordinates, basic pitch P, movable range R, and dot diameter D (or line width W) are first displayed on display unit 18 in Step 501. The operator therefore enters these data by manipulating the keyboard.

When pattern generator 100 determines that each of the above-described required data has been entered to data entry unit 11 in Step 502, entry confirmation unit 12 determines in Step 503 whether basic pitch P, movable range R, and dot diameter D (or line width W) that have been entered satisfy the relationship $P \geq 2R+D$ (or W). If it is determined that the data do not satisfy the relationship, a guidance message such as "The relationship between basic pitch P, movable range R, and dot diameter D (or line width W) is inappropriate. Should processing continue? Y/N" is displayed on display unit 18 in Step 504.

In Step 505, the operator then selects either to correct the data entry or to continue processing the data and directs the selection to pattern generator 100. When correction of entry is designated, pattern generator 100 again executes the previously described processing of Steps 501-503. If the continuation of processing is designated, the data entry is confirmed and processing proceeds to Step 506.

In Step 506, array generation unit 13 of pattern generator 100, in accordance with entered basic pitch P, arranges base coordinates at the positions of the vertices of pseudo equilateral triangles in which only the even-numbered rows of coordinate positions that have been arranged in columns and rows are displaced half the basic pitch P in the column direction, as shown in FIG. 2A.

Random number generator 14 next generates random numbers in Step 507. Coordinate displacement unit 15 then generates data of a multiplicity of displaced coordinates by using the random numbers to randomly displace each of the multiplicity of base coordinates that have been regularly arranged. At this time, the range of displacement is limited within range R entered by data entry unit 11, as shown in FIGS. 2B and 2C.

When generating displaced coordinates in this way, however, coordinate displacement unit 15 also generates a distribution graph of the displacements of the displaced coordinates as shown in FIG. 3 and controls the displacement of base coordinates such that half-width H satisfies the relationship $0.3\ P \leq H \leq 0.9\ P$ in Step 509.

It is next determined in Step 510 whether the switching data designate dots. If the designation is for dots, pattern data are generated in which a dot pattern with dot diameter D are arranged at each of the multiplicity of displaced coordinates as shown in FIG. 2D in Step 511. If lines are designated, pattern data are generated in which a line pattern with line width W is arranged at each side of a hexagon that takes as vertices the six displaced coordinates that are positioned around a single displaced coordinate, as shown in FIG. 4.

The pattern data thus generated are displayed on display unit 18 in Step 513. The operator checks the displayed pattern data and, from keyboard 10, instructs pattern generator 100 whether to confirm or amend the pattern data in Step 514. When instructions to amend are entered, pattern generator 100 repeats the processing of the above-described Steps 501-513. When instructions to confirm are entered, data output unit 17 sends the pattern data to a data processor (not shown) of photomask fabrication device 120 in Step 515.

Photomask fabrication device 120 forms light-transmitting portions 202 on mask material 201 by photoetching with the pattern data generated by pattern generator 100 to fabricate photomask 200 as shown in FIG. 6. For dot-type photomask 200a, light-transmitting portions 202 are formed with a dot pattern with dot diameter D at each of a multiplicity of displaced coordinates as shown in FIG. 6A, these displaced coordinates having been obtained by randomly displacing within movable range R each of regular base coordinates. For a line-type photomask 200b, on the other hand, light-transmitting portions 202 are formed with a line pattern with line width W at each side of hexagons as shown in FIG. 6B, these hexagons taking as vertices the six displaced coordinates that are positioned around single displaced coordinate.

In reflector fabrication device 130, photomask 200 thus fabricated is loaded in an exposure device (not shown) and is used in the photoetching of the surface of base member 302. Base member 302 constitutes a portion of liquid crystal display 300 as previously described, and photoetching by means of photomask 200 is therefore carried out for the position of each liquid crystal picture element.

Metal thin-film 303, which is to constitute the picture element electrodes, is formed at the position of each liquid crystal picture element of base member 302 in which unevenness has been formed by the photoetching. This results in the generation of unevenness on the surface of this metal thin-film 303 that is identical to that on the surface of base part 302. That is, metal thin-film 303 is formed at the position of each liquid crystal picture element on reflective substrate 301, and random unevenness is formed with the same dot pattern or line pattern as on photomask 200 on each of the surfaces of the multiplicity of metal thin-films 303.

Liquid crystal fabrication device 140 mounts transparent substrate 312 at a predetermined spacing on the surface of reflective substrate 301 thus fabricated, and interpose liquid crystal layer 311 between reflective substrate 301 and transparent substrate 312 to form reflective liquid crystal display 300. Portable terminal fabrication device 150 fabricates portable terminal device 400 using liquid crystal display 300 thus fabricated.

With random unevenness formed on the surface of metal thin-film 303 for each liquid crystal picture element on reflective substrate 301, metal thin-film 303, which is immersed in liquid crystal layer 311, can reflect incident light with good characteristics, rendering the viewability of a displayed image on liquid crystal display 300 excellent.

Moreover, the unevenness formed on the surface of metal thin-film 303 of this reflective substrate 301 is formed corresponding to each of a multiplicity of displaced coordinates obtained by random displacement of each of regular base coordinates. No overlapping or excessive distance occurs between points of unevenness because this random displacement is limited within movable range R, and because the relationship between basic pitch P, movable range R, and dot diameter D (or line width W) satisfies the condition $P \leq 2R+D$ (or W). In particular, when the unevenness of reflective substrate 301 is formed with line patterns, unevenness in line form is formed at each side of hexagons, making the reflection characteristics particularly good.

Further, the half-width H of the pitch distribution graph of these depressions or protrusions satisfies the condition $0.3\,Pa \leq H \leq 0.9\,Pa$ and the average pitch Pa of the depressions or protrusions satisfies the condition $1.0\,\mu m \leq Pa \leq 80\,\mu m$. As a result, the reflection characteristics of reflective substrate 301 of liquid crystal display 300 is particularly good and an image can be displayed with excellent viewability without using a backlight.

For this reason, portable terminal device 400 has no need for a backlight, and the entire device can therefore be made smaller and lighter and the productivity of the device can be improved. Even if a backlight is provided, the amount of time the backlight must be used can be reduced, making the batteries smaller and providing power for a longer time period.

As discussed hereinabove, pattern generator 100 generates pattern data in which dot patterns or line patterns are randomly displaced within a movable range R from regular base coordinates to thereby prevent overlapping or excessive distance between the dot patterns or line patters by movable range R. In particular, the base coordinates can be randomly displaced by simple data processing because the base coordinates are displaced in accordance with random numbers within a movable range R.

Further, when the pattern data are produced by line patterns, a line pattern with line width W are arranged at each side of hexagons that take displaced coordinates as vertices. This results in excellent reflection characteristics when the pattern data are employed to form unevenness on the reflecting surface of reflective substrate 301 of reflective liquid crystal display 300.

Moreover, confirming that basic pitch P, movable range R, and dot diameter D (or line width W) that are entered satisfy the condition $P \geq 2R+D$ (or W) allows the reliable generation of pattern data in which adjacent dot patterns or line patterns do not overlap.

Further, base coordinates are displaced such that the half-width H of the distribution graph the displacement pitch of the displaced coordinates satisfies the condition $0.3\,P \leq H \leq 0.9\,P$. This results in excellent reflection characteristics when the pattern data are employed to form unevenness on the reflecting surface of reflective substrate 301 of reflective liquid crystal display 300.

In addition, as the basic pattern of unevenness of reflective substrate 301 of liquid crystal display 300, base coordinates can be arranged by a simple process at the positions of the vertices of pseudo equilateral triangles because the base coordinates are arranged at positions such that even-numbered rows of coordinate positions are displaced, by one-half the basic pitch P in a column direction relative to odd-numbered rows of coordinate positions.

It is to be noted that because the base coordinates of pseudo equilateral triangles that have been thus generated from coordinates of squares have different spacing in the horizontal direction and vertical (diagonal) direction, the reflection characteristics also differ for the horizontal and vertical directions of reflective substrate 301 that corresponds to these pattern data. On the other hand, since display characteristics such as the angle of field typically differ in the vertical and horizontal directions of liquid crystal layer 311 of liquid crystal display 300, the viewability of liquid crystal display 300 can be further improved by making the directivity of the display characteristics of this liquid crystal layer 311 correspond to the directivity of the reflection characteristics of reflective substrate 301.

Photomask fabrication device 120 fabricates photomask 200 using pattern data generated by pattern generator 100. This makes it possible to fabricate photomask 200 that can form unevenness having excellent reflection characteristics on the reflecting surface of reflective substrate 301 of reflective liquid crystal display 300.

Photomask 200 thus fabricated has either light-transmitting portions 202 or light-blocking portions with dot patterns with dot diameter D at each of a multiplicity of displaced coordinates that are derived by randomly displacing, within movable range R, each of a multiplicity of base coordinates that have been regularly arranged according to basic pitch P. This makes it possible to form unevenness having excellent reflection characteristics on the reflecting surface of reflective substrate 301 of reflective liquid crystal display 300, as described hereinabove.

Reflector fabrication device 130 forms unevenness on the reflecting surface of reflective substrate 301 by means of photoetching that employs photomask 200 fabricated by photomask fabrication system 120. This makes it possible to fabricate reflective substrate 301 of reflective liquid crystal display 300 having excellent reflection characteristics as previously described.

Liquid crystal fabrication device 140 fabricates liquid crystal display 300 using reflective substrate 301 fabricated by reflector fabrication device 130, resulting in liquid crystal display 300 having excellent viewability.

Portable terminal fabrication device 150 fabricates portable terminal device 400 using liquid crystal display 300 fabricated by liquid crystal fabrication device 140, resulting in portable terminal device 400 having a display with excellent viewability.

The present invention is not limited to the above-described embodiment and may take the form of the following modifications without departing from the scope of the invention.

In the above-described embodiment, an example was described in which pattern generator 100 uses a circular shape as a dot pattern. However, the dot pattern may be of ellipse, a shape encircled by a curve, or polygon such as triangle, quadrilateral, pentagon, and hexagon, and may be of a separate shape. Dot pattern data may be produced by arranging dot patterns at least a portion of the displaced coordinates produced by coordinate displacement unit 15.

In the above-described embodiment, as a line pattern, pattern data was produced by arranging a line pattern with a line width at each side of a predetermined polygon that takes as vertices all or a portion of displaced coordinates generated by coordinate displacement unit 15. However, a portion of line patterns may be arranged at all or a portion of the displaced coordinates.

In the above-described embodiment, an example was described in which pattern generator 100 generates pattern data using only one of dot patterns and line patterns. However, when line patterns are arranged at the positions of each side of a hexagon that takes six displaced coordinates as vertices as previously described, an unused displaced coordinate is located at the center of the hexagon, and a dot pattern may be positioned at this displaced coordinate.

In the above-described embodiment, an example was described in which a line pattern with a line width W at each side of a polygon that takes as vertices all or a portion of a multiplicity of displaced coordinates. However, the line pattern may not be a straight line, and may be a curved line. The curved line may be of plural types. For example, curved lines are generated in accordance with predetermined functions with all or a portion of displaced coordinates generated by coordinate displacement unit 15 as a start point to arrange line patterns.

In the above-described embodiment, a case was described in which base coordinates were arranged at positions derived by displacing, by one-half the basic pitch P in the column direction, only even-numbered rows of coordinate positions relative to odd-numbered rows of coordinate portions, whereby base coordinates were arranged by a simple process at the positions of the vertices of pseudo equilateral triangles. However, the base coordinates may also be simply arranged in, for example, rows and columns without displacing in this way.

As the method of displacing base coordinates within a movable range R in accordance with random numbers in the above-described embodiment, a case was described in which the direction and distance of displacement of a base coordinate were generated by two random numbers. However, the movable range may be taken as a rectangle and displacement distances in the vertical and horizontal directions may be generated by two random numbers.

As the method of generating displaced coordinates from base coordinates in the above-described embodiment, a case was described in which all base coordinates were randomly displaced. However, since data can be generated even if, for example, only a portion of the base coordinates are displaced, it is possible to randomly displace only odd-numbered rows and not displace even-numbered rows.

In the above-described embodiment, a case was described in which base coordinates were randomly displaced to generate displaced coordinates that are randomly arranged in two dimensions. However, as an example, displaced coordinates may also be generated without using base coordinates by using random numbers that are generated two at a time as x and y coordinates.

Further, in the above-described embodiment, an example was described in which reflector fabrication device 130 uses high-transmitting portion 202 in the form of a dot pattern as shown in FIG. 6A, and light-blocking portion 201 in the form of a line pattern as shown in FIG. 6B, as a photomask fabricated by photomask fabrication device 120. However, the line pattern shown in FIG. 6B may be light-transmitting portion 202, and the dot pattern shown in FIG. 6A may be light-blocking portion 201, which constitute a reversed mask.

Photomask 200 is fabricated by photomask fabrication device 120 as described above, and has light-transmitting portions 202 formed with dot patterns with dot diameter D at each of the multiplicity of the displaced coordinates derived by displacing within the movable range W each of the multiplicity of the basic coordinates regularly arranged in accordance with the basic pitch as shown in FIG. 5A.

An example was described in which unevenness are formed on reflective substrate 301. However, for example, reflector fabrication device 130 may acquire pattern data directly from pattern generator 100, making it possible to form unevenness on reflector substrate 301 without using photomask 200.

In the above-described embodiment, a case was described in which reflector fabrication device 130 form unevenness on reflective substrate 301 using photomask 200 fabricated by photomask fabrication device 120 according to pattern data generated by pattern generator 100. However, reflector fabrication device 130 may, for example, form unevenness on reflective substrate 301 without using photomask 200 by directly acquiring pattern data from pattern generator 100.

In the above-described embodiment, a case was described in which unevenness was formed on the surface of base part 302 of reflective substrate 301 by means of photolithography in accordance with pattern data, following which metal thin-film 303 was formed on base member 302, whereby unevenness was produced on the surface of metal thin-film 303 that corresponds to the pattern data. However, unevenness that corresponds to the pattern data may be formed by photolithography on the surface of metal thin-film (not shown) that is grown on the surface of base member 302.

In the above-described embodiment, a case was described in which, by forming unevenness that corresponds to pattern data on the surface of base part 302 at the position of each liquid crystal picture element of liquid crystal display 300, unevenness was produced on the entire surface of metal thin-film 303 for each liquid crystal picture element. However, unevenness may be formed on the entire surface of base part 302, or alternatively, unevenness may be produced on only a portion of the surface of metal thin-film 303.

In the above-described embodiment, a case was described in which each portion of pattern generator 100 was constituted by hardware. However, a program for realizing the functions of pattern generator 100 may be recorded on a computer-readable recording medium, and the program recorded on the recording medium may then be executed by a computer. The computer-readable recording medium refers to a recording medium such as a floppy disk, a magneto-optic disk, a CD-ROM or a storage unit such as a hard disk that is incorporated in a computer system. The computer-readable recording medium further includes a medium (a transmission medium or transmission wave) that temporarily and dynamically holds a program such as when a program is transmitted by way of the Internet, as well as a medium that hold a program for a fixed time period such as a volatile memory within the computer system that is the server in such cases.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A device for generating pattern data for unevenness that is randomly arranged on a reflecting surface, said device comprising:
   a coordinate displacement device that generates a multiplicity of displaced coordinates that are randomly displaced in two dimensions with a limitation on the arrangement of patterns to prevent overlap or excessive distance between dot patterns;

a pattern generator that arranges said dot patterns according to at least a portion of or all of said displaced coordinates generated by said coordinate displacement device to generate pattern data; and further comprising at least one of:
(i) an entry confirmation device that determines whether or not a basic pitch P, a movable range R, and a dot diameter D, entered in connection with the limitation on the arrangement of patterns, satisfy the relationship: $P \geq 2R+D$;
(ii) an arranging device that arranges the displaced coordinates in positions such that even-numbered rows of the displaced coordinates are displaced by one-half of said basic pitch in the column direction relative to odd-numbered rows of the displaced coordinates; and
(iii) a displacement device that displaces said displaced coordinates such that half-width H of a distribution graph of the displacements of said displaced coordinates satisfies the relationship with said basic pitch P: $0.3\ P \leq H \leq 0.9\ P$.

2. A device for generating pattern data for unevenness that is randomly arranged on a reflecting surface, said device comprising:

a coordinate displacement device that generates a multiplicity of displaced coordinates that are randomly displaced in two dimensions with a limitation on the arrangement of patterns to prevent overlap or excessive distance between patterns;

a pattern generator that arranges predetermined dot patterns according to at least a portion of or all of said displaced coordinates generated by said coordinate displacement device to generate pattern data; and further comprising at least one of:
(i) an entry confirmation device that determines whether or not a basic pitch P, a movable range R, and a dot diameter D, entered in connection with the limitation on the arrangement of patterns, satisfy the relationship: $P \geq 2R+D$;
(ii) an arranging device that arranges the displaced coordinates in positions such that even-numbered rows of the displaced coordinates are displaced by one-half of said basic pitch in the column direction relative to odd-numbered rows of the displaced coordinates; and
(iii) a displacement device that displaces said displaced coordinates such that half-width H of a distribution graph of the displacements of said displaced coordinates satisfies the relationship with said basic pitch P: $0.3\ P \leq H \leq 0.9\ P$.

3. A device for generating pattern data for unevenness that is randomly arranged on a reflecting surface, said device comprising:

a data entry device for entering a basic pitch, a movable range, and a dot diameter;

an array generation device that regularly arranges a multiplicity of base coordinates in two dimensions in accordance with said basic pitch entered by said data entry device;

a coordinate displacement device that randomly displaces within said movable range at least a portion of said base coordinates arranged by said array generation means to generate a multiplicity of displaced coordinates;

a pattern generator that arranges a dot pattern with said dot diameter at each of the multiplicity of said displaced coordinates generated by said coordinate displacement means to generate pattern data; and further comprising at least one of:
(i) an entry confirmation device that determines whether or not said basic pitch P, said movable range R, and said dot diameter D entered by said data entry device satisfy the relationship: $P \geq 2R+D$;
(ii) an arranging device, included in the array generation device, that arranges the displaced coordinates in positions such that even-numbered rows of the displaced coordinates are displaced by one-half of said basic pitch in the column direction relative to odd-numbered rows of the displaced coordinates; and
(iii) a displacement device, included in the coordinate displacement device, that displaces said displaced coordinates such that half-width H of a distribution graph of the displacements of said displaced coordinates satisfies the relationship with said basic pitch P: $0.3\ P \leq H \leq 0.9\ P$.

4. A device according to claim 3, further comprising a random number generator that generates random numbers, wherein said coordinate displacement device displaces said base coordinates according to random numbers generated by said random number generator.

5. A non-transitory computer-readable storage medium storing a computer program for causing a computer to execute processes for generating pattern data for unevenness that is randomly arranged on a reflecting surface, said computer program comprising executable code that provides:

a first command set for entering a basic pitch, a movable range, and a dot diameter;

a second command set for regularly arranging a multiplicity of base coordinates in two dimensions in accordance with said basic pitch entered by said first command set;

a third command set for randomly displacing within said movable range at least a portion of said base coordinates arranged by said second command set; and a fourth command set for arranging dot patterns with said dot diameter at least a portion of the multiplicity of said displaced coordinates generated by said third command set, wherein, at least one of the following is further provided:
(i) the second command set provides for arranging said base coordinates in positions such that even numbered rows of the base coordinates are displaced by one half of said basic pitch in the column direction relative to odd numbered rows of the base coordinates;
(ii) the third command set provides for displacing said base coordinates such that half width H of a distribution graph of the displacements of said displaced coordinates satisfies the relationship with said basic pitch P: $0.3\ P \leq H \leq 0.9\ P$; and
(iii) the fourth command set provides that dot patterns are arranged according to the basic pitch P, the movable range R, and the dot diameter D satisfying the relationship: $P \geq 2R+D$.

* * * * *